(12) United States Patent
Fennell

(10) Patent No.: US 11,388,975 B1
(45) Date of Patent: Jul. 19, 2022

(54) ORGANIZING UNIT FOR HAIR STYLING TOOLS

(71) Applicant: Anthony Fennell, Hurley, NY (US)

(72) Inventor: Anthony Fennell, Hurley, NY (US)

( * ) Notice: Subject to any disclaimer, the term of this patent is extended or adjusted under 35 U.S.C. 154(b) by 562 days.

(21) Appl. No.: 16/514,204

(22) Filed: Jul. 17, 2019

(51) Int. Cl.
| | |
|---|---|
| A45D 44/02 | (2006.01) |
| H05K 5/02 | (2006.01) |
| H01R 25/00 | (2006.01) |
| A45D 2/00 | (2006.01) |
| A47C 7/62 | (2006.01) |
| A45D 1/00 | (2006.01) |

(52) U.S. Cl.
CPC ........... *A45D 44/02* (2013.01); *H05K 5/0247* (2013.01); *A45D 2/001* (2013.01); *A45D 2001/002* (2013.01); *A47C 7/622* (2018.08); *H01R 25/006* (2013.01)

(58) Field of Classification Search
CPC .. A45D 44/02; A45D 2/001; A45D 2001/002; A45D 44/04; A45D 44/00; A45D 2200/05; A45D 2200/25; H05K 5/0247; H05K 5/02; H05K 5/0217; A47C 7/622; H01R 25/006
See application file for complete search history.

(56) References Cited

U.S. PATENT DOCUMENTS

| | | | | |
|---|---|---|---|---|
| 5,875,794 A * | 3/1999 | Ekman | .................... | A45C 5/005 206/581 |
| 6,305,388 B1 * | 10/2001 | Zeller | .................... | A45D 44/02 132/287 |
| 6,331,121 B1 * | 12/2001 | Raeford, Sr. | .......... | H01R 13/72 174/67 |
| 6,769,554 B1 * | 8/2004 | Udofiah | ................. | A45D 44/06 211/85.3 |
| 7,513,361 B1 * | 4/2009 | Mills, Jr. | ................. | A45D 44/00 206/234 |
| 7,909,162 B1 * | 3/2011 | Barrett | .................... | A45D 44/00 132/286 |
| 9,814,315 B2 | 11/2017 | Osweiler | | |
| 10,117,515 B2 * | 11/2018 | Osweiler | .............. | H05K 5/0217 |
| 2009/0184077 A1 * | 7/2009 | Curet | ..................... | A47C 7/622 211/113 |
| 2017/0086586 A1 * | 3/2017 | Osweiler | .............. | H05K 5/0213 |

* cited by examiner

*Primary Examiner* — Bao Q Truong
(74) *Attorney, Agent, or Firm* — Sanchelima & Associates, P.A.; Christian Sanchelima; Jesus Sanchelima

(57) ABSTRACT

An organizing unit for multiple hair styling tools is disclosed herein. The organizing unit comprises a housing. The organizing unit also comprises one or more compartments formed in the housing. The one or more compartments are adapted to accommodate at least one of the multiple hair styling tools therein. The organizing unit further comprises a retractable arrangement comprising an electric cord and a retractable plug. The electric cord is configured to supply electric power to the retractable plug. The retractable plug comprises a cord spool post to wound the electric cord thereon; and a power transfer core adapted to allow power cords of one of the hair styling tools to be electrically connected thereto.

15 Claims, 7 Drawing Sheets

ORGANIZING UNIT FOR HAIR STYLING TOOLS

BACKGROUND OF THE INVENTION

1. Field of the Invention

The present disclosure generally relates to an organizing unit for holding and storage of electrical tools, and more particularly, relates to an organizing unit which provides a singular solution to arrange and operate multiple hair styling tools with ease and without clutter.

2. Description of the Related Art

Businesses, such as hair salon, employ a number of electrical tools, including, but not limited to, hair dryers, curling irons, flat irons, clippers, etc. Moreover, many home users, like women, also tend to have these tools for hairstyling purposes. Usually, it is desirable that these tools are readily available within easy reach of a stylist while attending to a client or a user trying to style her own hair. Typically, the salon owners and workers tend to keep these tools lying on the table with their power cords connected to the electrical sockets for convenience. Such cords are usually of excess length, and thus may simply lie in loops on the floor. In this situation, the cords may easily get damaged, or may cause persons to trip. Moreover, with the cords being connected to electrical sockets, there is a risk that some person coining in contact with a cord may experience electric shock with is undesirable.

Additionally, after-use storage of these hair care tools is a problem. The hair care tools when placed on a countertop or in a drawer take up valuable space and the electrical cords of these tools can get mixed up and get entangled with other electrical cords. Also, keeping the tools in the open, for example, on the countertop, may make the workplace untidy which is undesirable. In a salon where each stylist typically has his or her own work-station as well as his or her own hair care tools and appliances, storage of these tools during use and after-use becomes even more important.

Applicant believes that a related reference corresponds to U.S. Pat. No. 9,814,315 (referred to as '315 patent) which discloses a salon chair with a tool caddy and an integral electrical supply. A salon chair that includes an integrated tool work station with the capacity to hold a hair dryer, curling irons, clippers and the like at the rear of the chair. The chair is powered by an integrated electrical power source inside the chairs' tool compartment and power is supplied through to the base of the chair. The power source may be connected to an outlet under the chair or concealed under a power extension with cord cover, or may be otherwise coupled to utility power. However, such salon chair as disclosed in the '315 patent may be an expensive additional investment for a business, as it may render existing chair obsolete. Moreover, the disclosed salon chair of the '315 patent does not provide any means for managing and organizing extra length cords for electrical tools Documents describing the closest subject matter provide for a number of more or less complicated features that fail to solve the problems described above in an efficient and economical way. None of the documents suggest the novel features of the present invention.

SUMMARY OF THE INVENTION

It is one of the objectives of the present invention to provide an organizing unit for managing and storing of electrical tools along with their excessive length electrical cords.

It is another objective of the present invention to provide an organizing unit with a retractable plug to prevent tangling of the electrical cords associated with the electrical tools.

It is yet another objective of the present invention to provide an organizing unit which is inexpensive, durable, aesthetically pleasing and further easy to manufacture.

Further objects of the invention will be brought out in the following part of the specification, wherein detailed description is for the purpose of fully disclosing the invention without placing any limitations thereon.

BRIEF DESCRIPTION OF THE DRAWINGS

With the above and other related objects in view, the invention consists in the details of construction and combination of parts as will be more fully understood from the following description, when read in conjunction with the accompanying drawings in which.

DETAILED DESCRIPTION OF THE EMBODIMENTS OF THE INVENTION

Illustrative embodiments of the present invention are described below. The following explanation provides specific details for a thorough understanding of and enabling description for these embodiments. One skilled in the art will understand that the invention may be practiced without such details. In some instances, well-known structures, processes and functions have not been shown or described in detail to avoid unnecessarily obscuring the description of the embodiments.

It shall be noted that unless the context clearly requires otherwise, throughout the description, the words "comprise," "comprising," "include," "including," and the like are to be construed in an inclusive sense as opposed to an exclusive or exhaustive sense; that is to say, in the sense of "including, but not limited to." Words using the singular or plural number also include the plural or singular number, respectively while adhering to the concepts of the present invention. Furthermore, references to "one embodiment"

and "an embodiment" are not intended to be interpreted as excluding the existence of additional embodiments that also incorporate the recited features.

Figure 1:
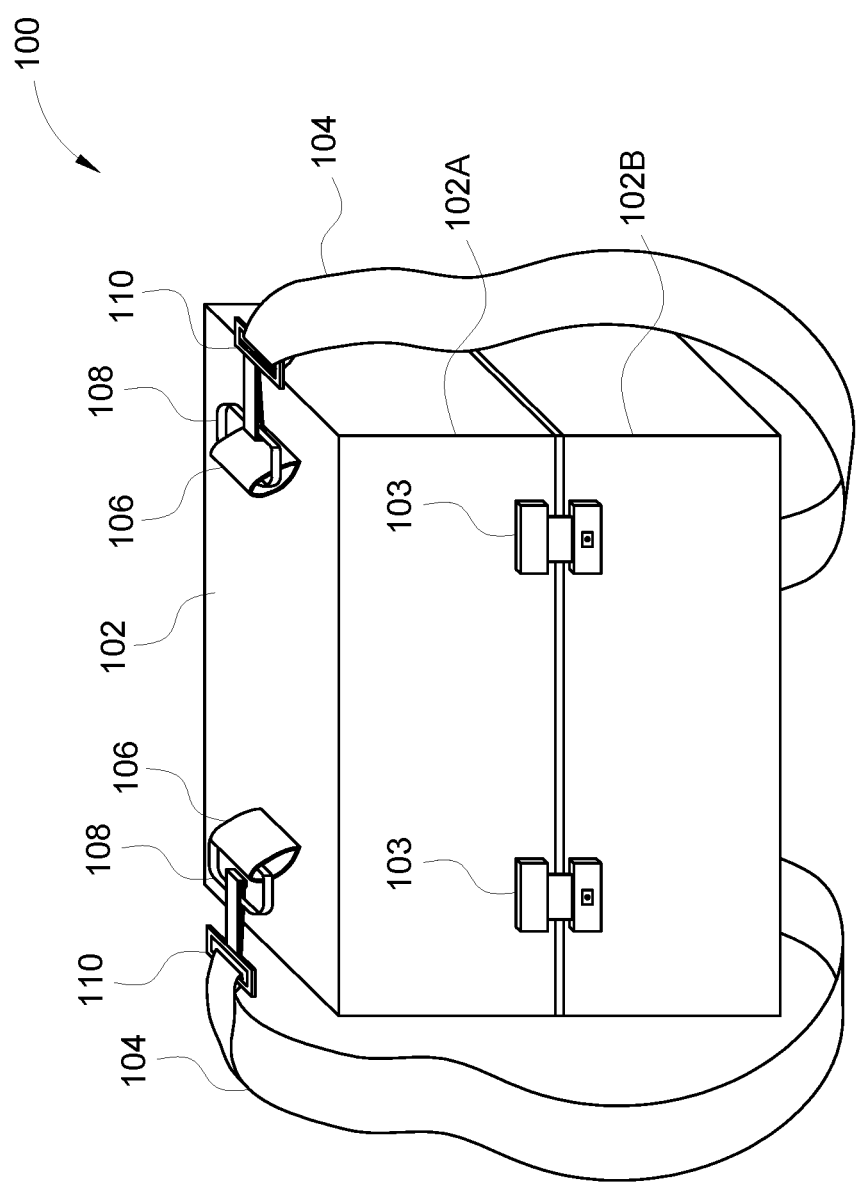
FIG. 1 illustrates a diagrammatic front perspective view of an organizing unit 100 in a closed state thereof, in accordance with an alternate embodiment of the present invention.

Referring to the drawings, FIG. 1 illustrates a diagrammatic view of an organizing unit, referred by the numeral 100, in accordance with one or more embodiments of the present invention. The organizing unit 100 is designed to be utilized in hair salons, beauty parlors, etc. for handling and storage of multiple hair styling tools 160, like typical electrical cosmetic appliances, such as hair dryers, curling irons, flat irons, hot comb plates, clippers, and the like. The organizing unit 100 is generally shaped to be placed on countertop or utilized with existing salon counter fixtures. The organizing unit 100 of the present invention efficiently manages and organizes electrical cords associated with multiple hair styling tools 160 used in hair salons. Although the present disclosure has been described in terms of application of the organizing unit 100 in hair salons, it may be contemplated that the present organizing unit 100 can be utilized in home environment, such as personal make-up room which may have multiple electrical tools with long electrical cords associated therewith.

Figure 1A:
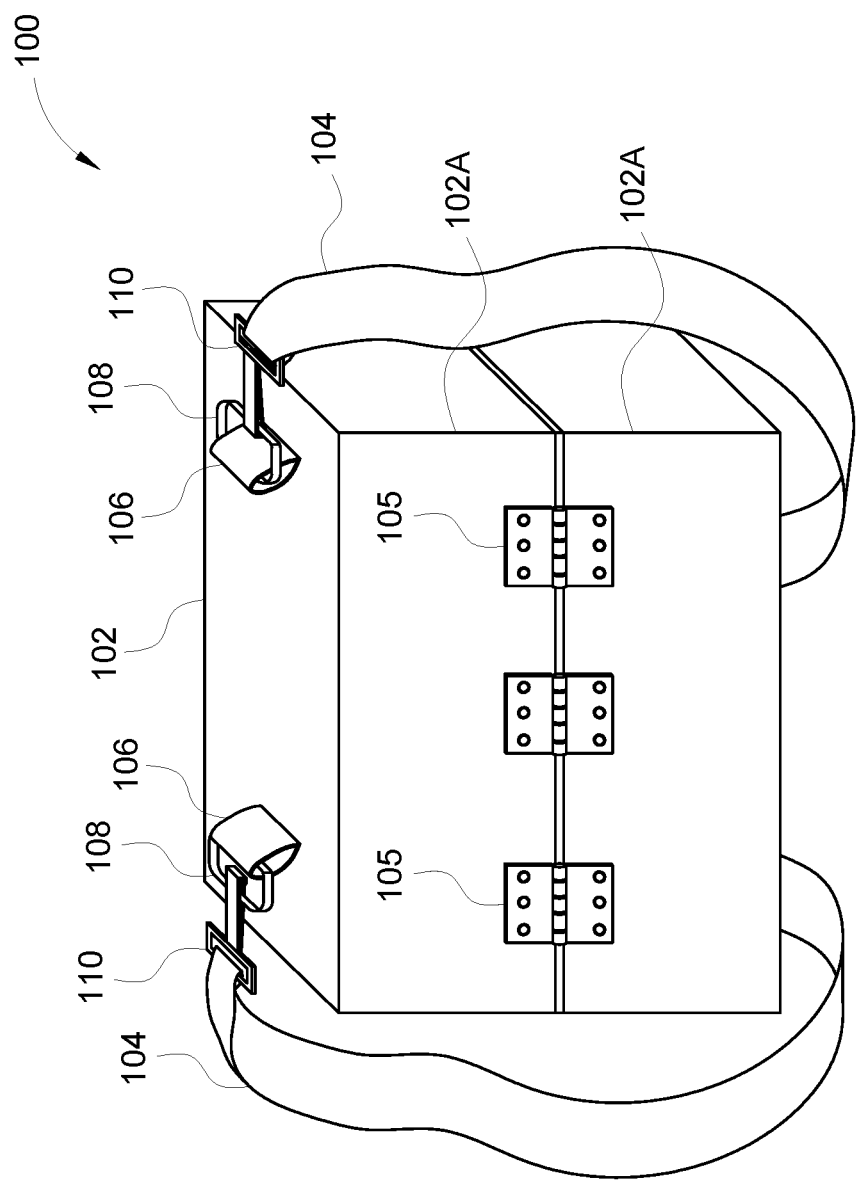
FIG. 1A illustrates a diagrammatic rear perspective view of the organizing unit 100 in a closed state thereof, in accordance with an alternate embodiment of the present invention.
Figure 2:
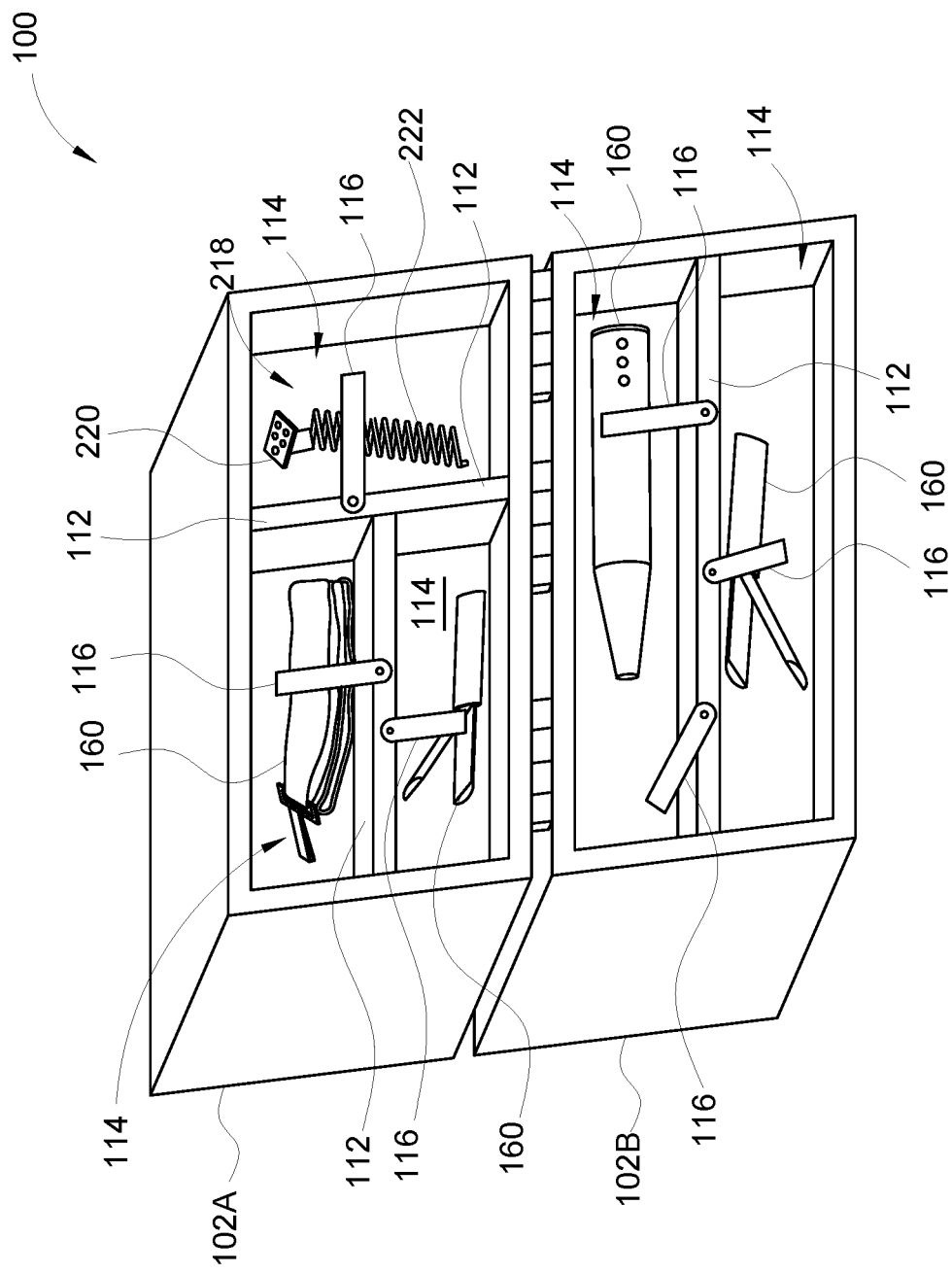
FIG. 2 illustrates a diagrammatic perspective view of the organizing unit 100 of FIGS. 1-1A in an open state thereof, in accordance with the alternate embodiment of the present invention.

FIGS. 1-1A and FIG. 2 illustrate diagrammatic views of an organizing unit 100, in accordance with an embodiment of the present invention. It may be appreciated that the organizing unit 100 may have electrical connection and a retractable arrangement therewith. In particular, FIG. 1 illustrates a front view of the organizing unit 100 in closed state, FIG. 1A illustrates a rear view of the organizing unit 100 in closed state, and FIG. 2 illustrates a perspective view of the organizing unit 100 in an open state. The organizing unit 100 of is designed to be portable for handling and storage of multiple hair styling tools 160. As illustrated, the organizing unit 100 includes a casing 102 having two housings 102A and 102B pivotally coupled together to dispose the casing 102 between the open state and closed state thereof.

As illustrated in FIG. 1, the organizing unit 100 includes latches 103 to lock the housing 102A against the housing 102B. Further, as illustrated in FIG. 1A, the organizing unit 100 includes hinges 105 for pivotally coupling the housing 102A with the housing 102B and thereby stabilizing opening and closing of the casing 102. In one or more examples, the hinges 105 may be brass hinges. As illustrated in combination of FIGS. 1-1A, the organizing unit 100 further includes two shoulder straps 104 attached to the casing 102 for safely transporting thereof during travel. In particular, the organizing unit 100 may include two clamps 106 attached to the casing 102 which are further provided with O-rings 108. The shoulder straps 104 may be provided with clamp hooks 110 at one end to be coupled with O-rings 108, for securing the shoulder straps 104 with the casing 102.

Further, as illustrated in FIG. 2, the two housings 102A and 102B include a number of dividers 112 to form compartments 114 inside respective inner spaces. Each of compartment 114 may be individually sized by arrangement of the corresponding dividers 112 to be customized for holding one of the multiple hair styling tools 160, from the multiple types of available multiple hair styling tools 160. In one of the compartments 114, a retractable cord may be stored. Further, in some examples, the handle 300 may be stored in one of the compartments 114, not shown in FIG. 2. In one or more embodiments, each of the compartments 114 may be provided with a stop latches 116 which may be rotatably fixed to one of the dividers 112 corresponding to that compartment 114. As may be contemplated by a person skilled in the art, such stop latches 116 may be rotated to be in line with the respective divider 112 to allow insertion of the hair styling tools 160 in the corresponding compartment 114, and then may be rotated back to be almost perpendicular to the respective divider 112 to stop falling or removing of the hair styling tools 160 from the corresponding compartment 114.

Figure 3:
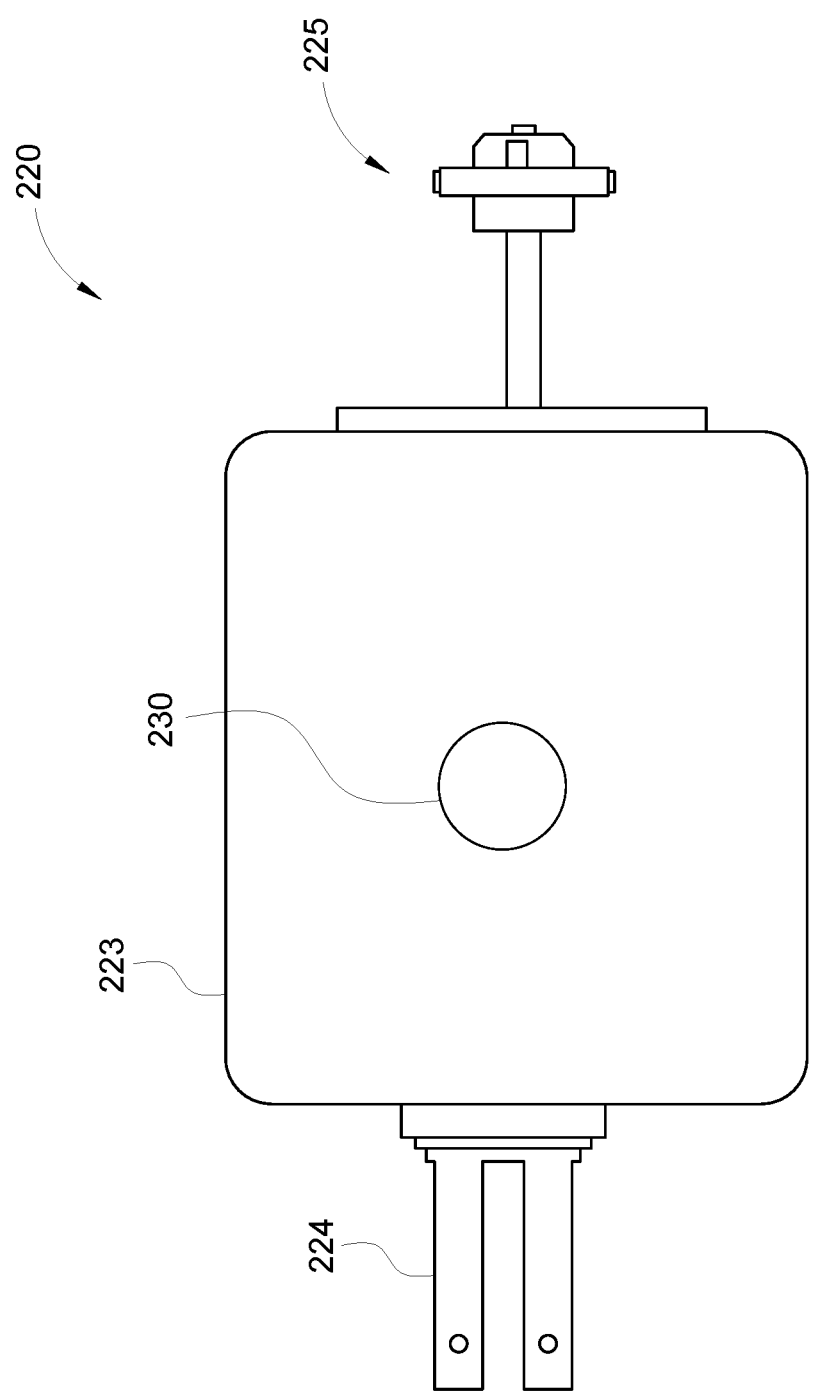
FIG. 3 illustrates a diagrammatic side planar view of a retractable plug 220 of the organizing unit 100, in accordance with one or more embodiments of the present invention.

FIG. 3 illustrates a simplified view of the retractable plug 220. As illustrated, the retractable plug 220 includes a housing 223 which may generally be rectangular in shape. Also, as illustrated, the retractable plug 220 includes a rotating prong 224. The rotating prong 224 provides an electrical connection, by acting as an electric plug, for the retractable arrangement 218 with the housing 223. The rotating nature of the prong 224 adds versatility to the organizing unit 100, as such prong allows to connect the retractable plug 220 in any required orientation which may be helpful when using the organizing unit 100 in tight space or settings, like a bathroom counter or a saloon.

Further, as illustrated in FIG. 3, the retractable plug 220 includes a power transfer core 225 arranged at opposite end of the housing 223 with respect to the rotating prong 224. The power transfer core 225 may be disposed in electrical connection by means of the electric cord 222 which may be extending out from the housing 223. The power transfer core 225 may be adapted to allow the power cords of the hair styling tools 160 to be electrically connected thereto. For this purpose, the user may insert the plug of the desired hair styling tool 160 to the power transfer core 225. The power transfer core 225 may allow the power to be supplied from the retractable plug 220, or specifically the electrical connection in the housing 223, to the plugged one of multiple hair styling tools 160. In one embodiment, the power transfer core 225 may be in the form of a dial which allows to regulate the amount of electricity, or specifically the amperage of the current supplied to the plugged hair styling tool 160. For instance, in case of one of the multiple hair styling tools 160 being a curling iron, the current supplied to the curling iron may be regulated from the power transfer core 225 to increase or decrease the rate of heat generation, and thereby the temperature of the curling iron depending on the requirement for hair straightening purposes or the like.

Figure 4:
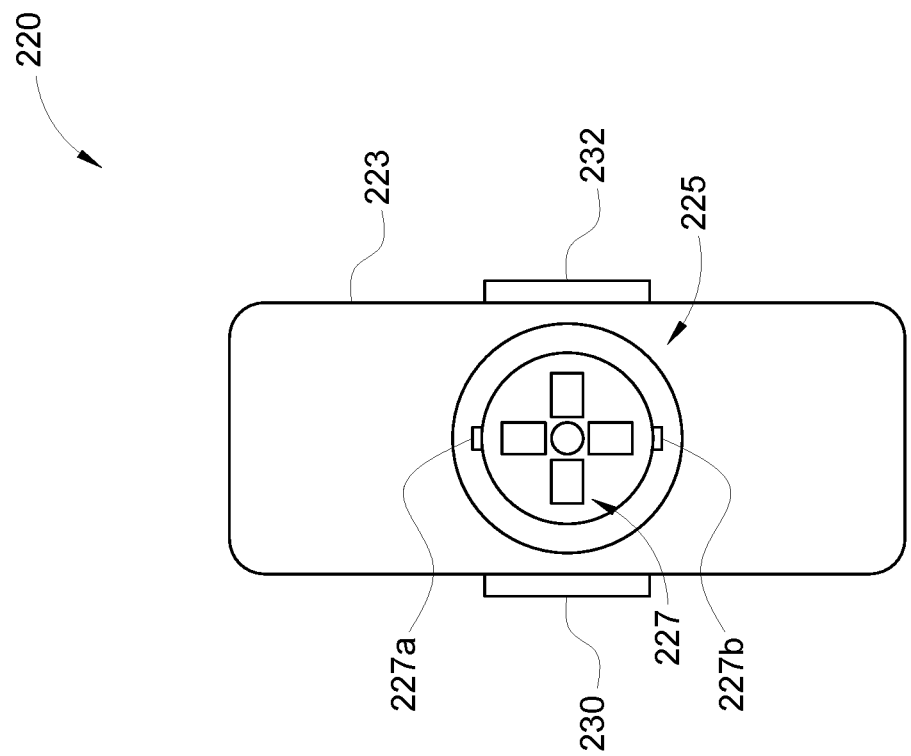
FIG. 4 illustrates a diagrammatic front planar view of the retractable plug 220, in accordance with one or more embodiments of the present invention.

FIG. 4 illustrates a side planar view of the retractable plug 220. In some examples, as better illustrated in FIG. 4, the power transfer core 225 may include a styling tool lock mechanism 227 which when engaged may avoid accidental release of electric connection between the retractable plug 220 and of the plugged multiple hair styling tools 160. The styling tool lock mechanism 227 may include a safety lock button 227a and a safety release button 227b which may be arranged along peripheral regions of the power transfer core 225. It may be understood that the safety lock button 227a and the safety release button 227b may be engaged or disengaged to, respectively, lock and unlock one of the multiple hair styling tools 160 from the power transfer core 225. Such lock mechanisms are used with many power tools and the like, and are well known in the art and thus have not been described herein.

Figure 5:
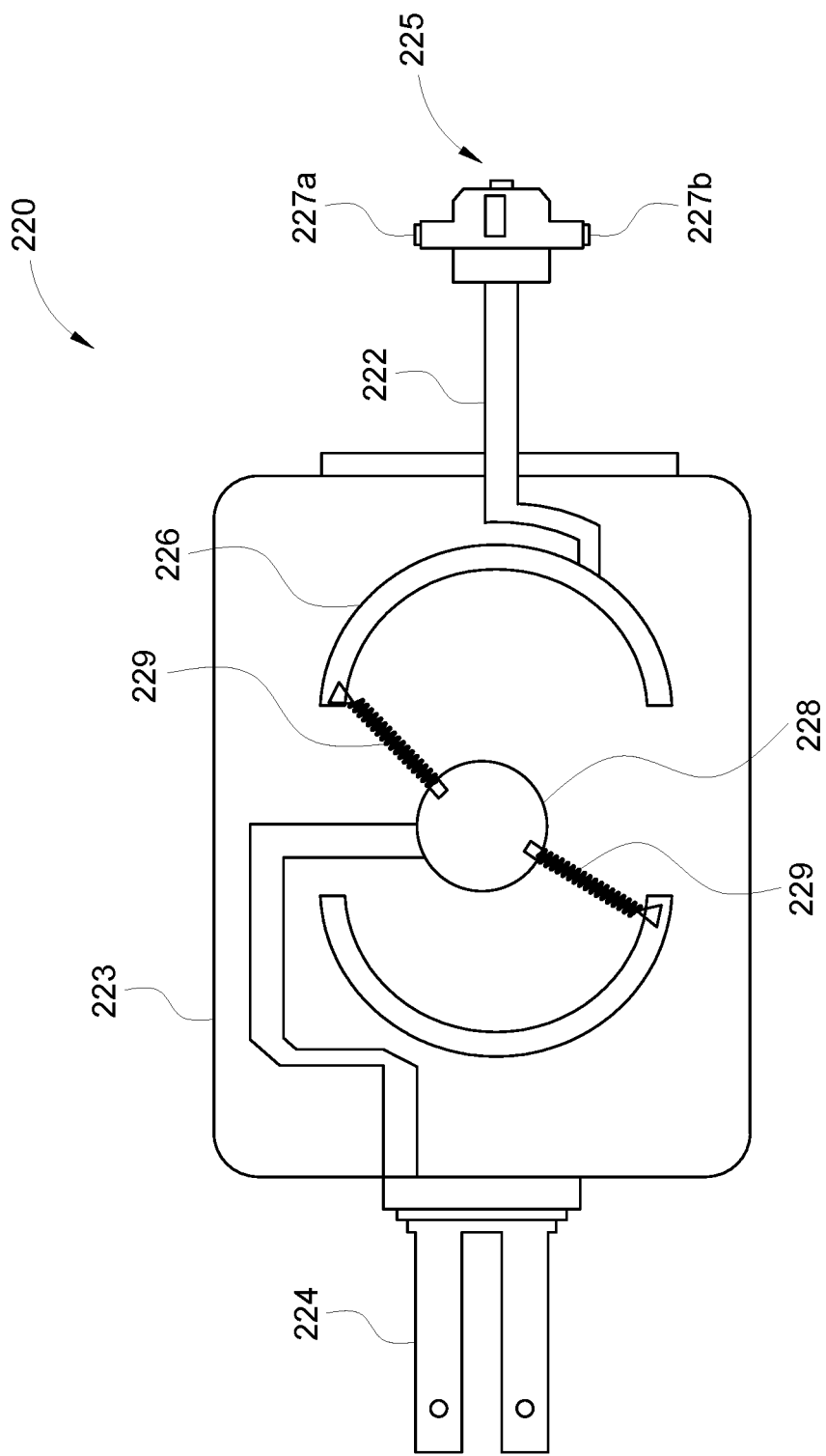
FIG. 5 illustrates a simplified sectional view of the retractable plug 220, in accordance with one embodiment of the present invention.

FIG. 5 illustrates a simplified sectional view of the retractable plug 220, removing all the electrical connection and circuits therefrom. As illustrated, the retractable plug 220 further includes a cord spool casing 226 in which a cord spool post 228 is arranged. It may be appreciated that the cord spool post 228 may be in the form of hollow casing, and the electric cord 222 may be wound around the cord spool post 228 in the form of a spool. In some examples, the cord spool casing 226 may include retractable springs 229 for supporting the electric cord 222 thereon. It may be understood that the electric cord 222 may be pulled to be unspooled from the cord spool post 228, due to its rotation, to increase its length, and may be released or pushed back to be spooled back onto the cord spool post 228, for example, by means of spring, like the retractable springs 229 or any other source of tension provided in the cord spool post 228, to decrease its length, as required for application of the organizing unit 100.

In one or more examples, the retractable plug 220 may include a spool lock 230 which may be provided on an outside of the cord spool casing 226, such as outside of the housing 223, as also shown in FIG. 3. The spool lock 230 may be in the form of a mechanical arrangement, such as, a cylinder key, which may engage with the cord spool post 228 to prevent rotation thereof, and thus preventing any possible accidental spooling of the electric cord 222 back on to the cord spool post 228 when the organizing unit 100 is in use. In such case, the retractable plug 220 may also include a spool release 232, as shown in FIG. 4, which may be provided on the outside of the cord spool casing 226, such as outside of the housing 223 opposite to the side in which the spool lock 230 is provided. Similar to the spool lock 230, the spool release 232 may be in the form of a mechanical arrangement, such as, a cylinder key, which may disengage the spool lock 230 from the cord spool post 228 to allow for rotation thereof, so as to allow spooling of the electric cord 222 back on to the cord spool post 228. In some examples, the spool lock 230 and the spool release 232 may be part of a single mechanical arrangement, such as a spring-loaded push and release button or the like which are well known in the art.

Figure 6:
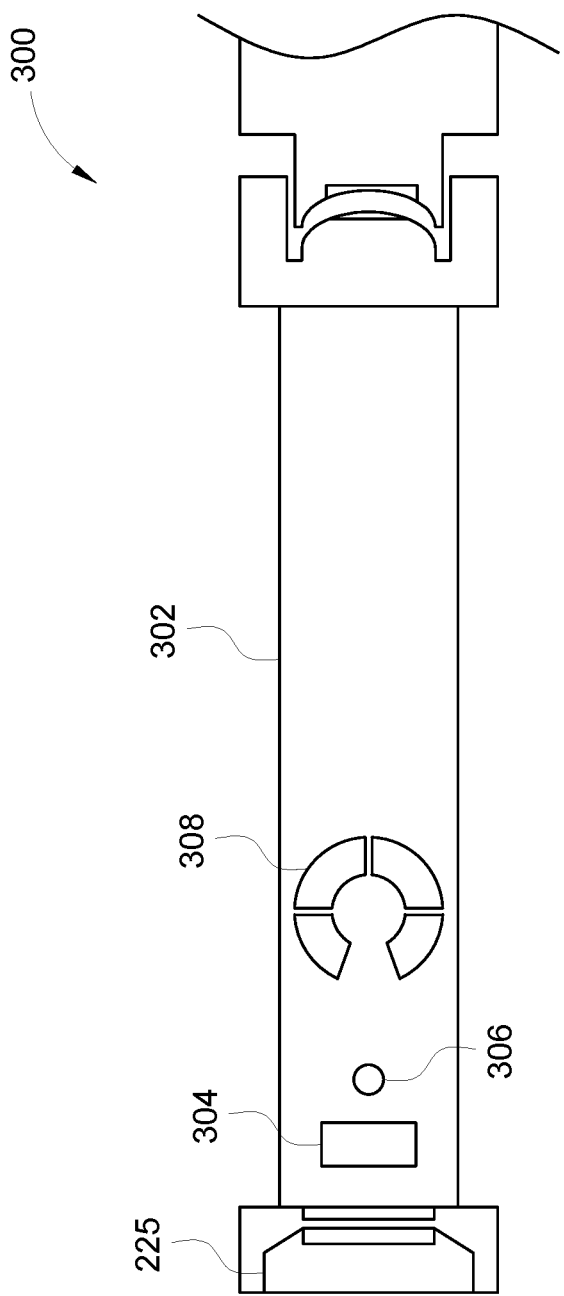
FIG. 6 illustrates a diagrammatic view of a handle 300 to be connected with the retractable plug 220 of the organizing unit 100 and to which the hair styling tool 160 is attached, in accordance with one or more embodiments of the present invention.

FIG. 6 illustrates an exemplary embodiment of a handle 300 for any of the multiple hair styling tools 160, to be used with the organizing unit 100 of the present disclosure. In the illustrated example, the handle 300 is shown to be coupled with the power transfer core 225. The handle 300 may allow the multiple hair styling tools 160 to be attached thereto for operation. The handle 300 may be adapted to be easily connected to the power transfer core 225 for receiving electricity. As illustrated, the handle 300 includes a body 302 which may provide a firm and comfortable grip to the user for holding any one of the multiple hair styling tools 160 during operation. In one or more embodiments, the handle 300 includes an ON/OFF switch 304 provided on the body 302, which may be used to control supply of power to any of the multiple hair styling tools 160 attached thereto. Further, the handle 300 includes a power indicator light 306 provided on the body 302 to indicate a status whether the electric power is being supplied to any of the multiple hair styling tools 160 or not. In some examples, the handle 300 may also include a temperature dial 308 provided on the body 302 and which may be implemented to control the temperature of any of the multiple hair styling tools 160 (such as, a curling iron) attached thereto, by regulating the amount of current supplied therefrom.

The organizing unit 100 of the present invention provides an effective way for storing and using various electrical hair-styling tools with long cords. The organizing unit 100 helps to prevent long cords from tangling while increasing organization, safety and convenience. This way the organizing unit 100 also prevents damage to the electrical cords, and helps keep the work area neat and clean. In some examples, the organizing unit 100 may be provided with a battery (not shown), for example, supported in the housing 102, to supply electrical power any one of the multiple hair styling tools 160, thus making possible to use the organizing unit 100 as a portable and a mobile unit. In some examples, a guide may be provided to indicate various styling temperature for different hair types. In some further examples, the multiple hair styling tools 160 (such as, the curling iron) as used with the organizing unit 100 of the present disclosure may have solid ceramic components which comes in contact with hair while styling so as to heat up reliably and evenly, thus providing safe styling of hairs without the risk of hot spots.

The foregoing description conveys the best understanding of the objectives and advantages of the present invention. Different embodiments may be made of the inventive concept of this invention. It is to be understood that all matter disclosed herein is to be interpreted merely as illustrative, and not in a limiting sense in any manner.

What is claimed is:

1. An organizing unit for multiple hair styling tools, comprising:
    a housing;
    one or more compartments formed in the housing, the one or more compartments adapted to accommodate at least one of the multiple hair styling tools therein; and
    a retractable arrangement comprising an electric cord and a retractable plug, wherein the electric cord is configured to supply electric power to the retractable plug and wherein the retractable plug comprises a cord spool post to wound the electric cord thereon and a power transfer core adapted to allow power cords of one of the hair styling tools to be electrically connected thereto.

2. The organizing unit of claim 1, wherein the electric cord is a coiled wire.

3. The organizing unit of claim 1, wherein the cord spool post is spring biased.

4. The organizing unit of claim 1, wherein the retractable plug comprises a rotating prong configured to receive the electric power.

5. The organizing unit of claim 1, wherein the retractable plug comprises a cord spool casing onto which the cord spool post is rotatably arranged.

6. The organizing unit of claim 5, wherein the retractable plug comprises a spool lock provided on an outside of the cord spool casing and configured to prevent rotation of the cord spool post.

7. The organizing unit of claim 6, wherein the retractable plug comprises a spool release provided on the outside of the cord spool casing and configured to disengage the spool lock.

8. The organizing unit of claim 1, wherein the power transfer core is configured to regulate the amount of current supplied to the hair styling tool.

9. The organizing unit of claim 1 further comprising a handle adapted to allow the hair styling tool to be attached thereto, wherein the handle is adapted to be connected to the power transfer core of the retractable plug and to allow the hair styling tool to be attached thereto.

10. The organizing unit of claim 9, wherein the handle comprises a switch to control supply of electric power to the hair styling tool attached thereto.

11. The organizing unit of claim 9, wherein the handle comprises a power indicator to indicate status of supply of electric power to the hair styling tool attached thereto.

12. The organizing unit of claim 9, wherein the handle comprises a temperature control dial to regulate temperature of the hair styling tool attached thereto.

13. The organizing unit of claim 1, wherein the housing is a rectangular box-shaped structure.

14. The organizing unit of claim 1, wherein the one or more compartments comprise four number of compartments.

15. An organizing unit for multiple hair styling tools, comprising:
- a housing;
- one or more compartments formed in the housing, the one or more compartments adapted to accommodate at least one of the multiple hair styling tools therein;
- a retractable arrangement comprising an electric cord and a retractable plug, wherein the electric cord is configured to supply electric power to the retractable plug and wherein the retractable plug comprises:
  - a cord spool casing;
  - a cord spool post rotatably arranged in the cord spool casing and adapted to allow wounding of the electric cord thereon;
  - a rotating prong configured to receive the electric power via the electric cord; and
  - a power transfer core adapted to allow power cords of one of the hair styling tool to be electrically connected thereto; and
- a handle adapted to allow one of the hair styling tool to be attached thereto, wherein the handle is adapted to be connected to the power transfer core of the retractable plug and to allow the hair styling tool to be attached thereto.

\* \* \* \* \*